United States Patent [19]
Dooley et al.

[11] Patent Number: 5,260,235
[45] Date of Patent: * Nov. 9, 1993

[54] METHOD OF MAKING LASER GENERATED I. C. PATTERN FOR MASKING

[75] Inventors: Daniel J. Dooley, Saratoga; Arthur R. Elsea, Jr., Freemont, both of Calif.

[73] Assignee: Lasa Industries, Inc., San Jose, Calif.

[*] Notice: The portion of the term of this patent subsequent to Apr. 14, 2009 has been disclaimed.

[21] Appl. No.: 750,738

[22] Filed: Aug. 21, 1991

Related U.S. Application Data

[63] Continuation of Ser. No. 632,658, Dec. 27, 1990, abandoned, which is a continuation of Ser. No. 199,055, May 26, 1988, abandoned.

[51] Int. Cl.$^5$ .................. H02L 21/467; H02L 21/428
[52] U.S. Cl. ..................................... 437/228; 437/173; 437/192; 437/193; 437/935
[58] Field of Search ............... 437/192, 193, 173, 935, 437/228

[56] References Cited

U.S. PATENT DOCUMENTS

| | | | |
|---|---|---|---|
| 4,217,393 | 8/1980 | Staebler | 437/233 |
| 4,242,156 | 12/1980 | Peel | 437/228 |
| 4,378,628 | 4/1983 | Levinstein | 437/202 |
| 4,450,041 | 5/1984 | Aklufi | 156/643 |
| 4,472,237 | 9/1984 | Deslauriers | 437/200 |
| 4,764,432 | 8/1988 | Kalbitzer | 430/5 |
| 4,788,157 | 11/1988 | Nakamura | 437/101 |
| 4,897,150 | 1/1990 | Dooley et al. | 156/657 |
| 5,104,481 | 4/1992 | Dooley et al. | 156/643 |

*Primary Examiner*—Brian E. Hearn
*Assistant Examiner*—Laura M. Holtzman
*Attorney, Agent, or Firm*—Cushman, Darby & Cushman

[57] ABSTRACT

An improved method of patterning layers on a semiconductor element by use of laser processing. A thin film of amorphous silicon is deposited on a fused quartz window. Selected regions of the amorphous silicon are crystallized by a laser beam focused through the quartz window. The non-crystallized silicon is removed forming an opaque layer of crystallized silicon in the desired pattern. The quartz window is used as a window to a reactive gas containment chamber containing semiconductor devices to be patterned. By irradiating the chamber with ultraviolet light through the patterned quartz window, the semiconductor element is etched in the regions exposed to the light.

12 Claims, 1 Drawing Sheet

METHOD OF MAKING LASER GENERATED I. C. PATTERN FOR MASKING

This is a continuation of application Ser. No. 07/632,658, filed on Dec. 27, 1990, which was abandoned upon the filing hereof which is a continuation of Ser. No. 07/199,055 filed May 26, 1988 which is now abandoned.

This invention relates to an improved method of patterning layers on a semiconductor element using laser processing.

Various techniques for direct writing on semiconductor materials have been developed wherein, for example, an electron beam "writes" a pattern in photoresist on an integrated circuit or other semiconductor element. Some of these prior direct write techniques have also included the use of laser beams. Laser patterning is inherently a linear process as opposed to bulk or batch processing as conventionally used in mass produced integrated circuits. Because time required for the direct write process of patterning with a laser beam is directly proportional to the length of the pattern drawn, the process is slow and limited in the number of devices that can be cost effectively processed. It would, however, be cost effective to use a laser technique to pattern a mask which can be used to replicate quickly and efficiently the pattern onto a semiconductor element.

In conventional technology, a pattern is transferred to a semiconductor substrate by the use of a photoresist. The number of photo masking steps to make a completed integrated circuit device is typically in the range of from 12 to 20 steps. Each photomasking step requires several steps of processing of the photoresist including coating, exposure, development and various temperature bake steps followed by an etching step to transfer into the semiconductor substrate the desired pattern. Each mask step has yield losses due to dust particles in the photoresist or between the mask and the photoresist layer. Other yield losses are due to chemical defects within the photoresist, alpha particle defects occurring within the photoresist, and photoresist adhesion problems at any step within in the photomasking process.

Accordingly, there is a need in the art for an improved method of patterning semiconductor materials on an integrated circuit. It is desirable that such a process be capable of being performed quickly and capable of economically processing a low volume of circuits. It, therefore, is an object of this invention to provide such an improved method.

SHORT STATEMENT OF THE INVENTION

The present invention is an improved method of forming integrated circuit patterns on semiconductor material. In accordance with the invention, a thin layer, for example, 2,000 Å of amorphous silicon is blanket deposited over the surface of a quartz or other transparent substrate. A focused laser beam with sufficient power having a wavelength of, for example, 5,145 Å, is directed onto the amorphous silicon layer and traverses over the layer to form a pattern for the integrated circuit. The laser beam heats the amorphous silicon in areas where the pattern is to occur, thereby crystallizing the silicon. Using conventional reactive ion plasma etching techniques, such as, a conventional $SF_6$ plasma etch, the non-crystallized amorphous silicon layer is etched away. The etching process is sufficiently selective to remove the amorphous silicon layer, yet leave the crystallized silicon pattern on the fused quartz substrate.

The patterned quartz substrate can now be used as a mask in, and a window to, a gas containment process chamber in which the semiconductor substrate to be patterned is located directly adjacent to the fused quartz window. By irradiating the semiconductor substrate to be patterned with ultraviolet light in the presence of a specific process gas such as $Cl_2$, the top layer of the semiconductor substrate such as $SiO_2$ can be selectively etched to transfer the laser generated mask pattern on the quartz window to the semiconductor substrate.

An advantage of the present invention is the elimination of photoresist and its inherent process problems and yield losses due to defects and contamination of the semiconductor device. Another advantage is that the laser used to generate the mask employs only thermodynamic properties of the laser and is limited only by its energy output. A third advantage is that all chemical processes for the formation of the mask and/or the transfer of the mask pattern onto the substrate are done in a batch or bulk mode independent of the design of the pattern.

BRIEF DESCRIPTION OF THE DRAWINGS

Other improvements, advantages and features of the present invention will become more fully apparent from the following detailed description of the preferred embodiment, the appended claims and the accompanying drawings in which:

DESCRIPTION OF THE PREFERRED EMBODIMENT

Figure 1A:
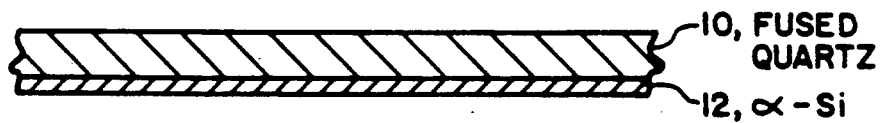
FIGS. 1a, b and c illustrate a series of steps in accordance with the preferred embodiment of the present invention.

Referring now to FIG. 1 which, by way of example, illustrates the preferred embodiment of the present invention. It should be appreciated that the laser generated pattern may be utilized in connection with any type or layer of integrated circuit or semiconductor material. By way of example, the invention may be utilized in forming openings in silicon dioxide prior to a doping step in the manufacture of integrated circuits. Regardless of the manufacturing step upon which the pattern is to be used, the initial step is a deposition of a thin layer of amorphous silicon onto a quartz window. The quartz window is used as a substrate for a thin, preferably 2,000 Å or less, layer of amorphous silicon. The quartz window should be of the type similar to that used for a conventional integrated circuit photomask having an optically flat surface with a low coefficient of thermal expansion and, most importantly, allow for the transmission of light in the ultraviolet wavelength range. Shown in FIG. 1a is the quartz substrate 10 having a 2,000 Å layer of amorphous silicon 12.

Figure 1B:
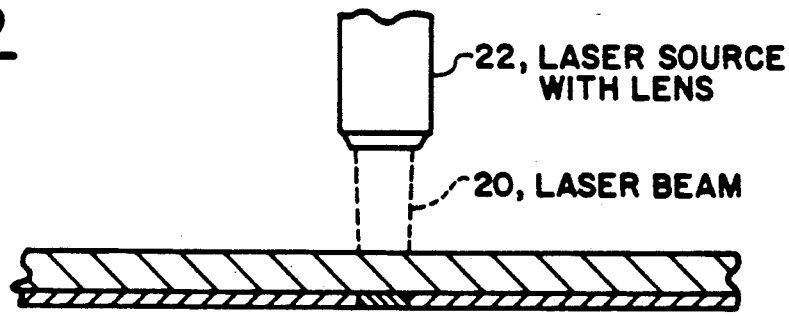

A focused laser beam 20, illustrated in FIG. 1b, having a wavelength of, for example, 5,145 Å, is emitted from a laser source 22. The laser beam 20 is focused through the quartz window onto the amorphous silicon. The laser beam traverses the quartz window in the pattern desired. The beam 20 heats the amorphous silicon 12 in the areas traversed by the laser beam. The heat of the laser beam activates the amorphous silicon layer 12 causing the amorphous silicon to be crystallized. Because no deposition has taken place during this pattern formation step, there is no gas dynamic or chemical reaction time limitations. The write time limitation on the rate of formation of the pattern is heat limited by the time needed to crystallized the amorphous silicon.

Figure 1C:
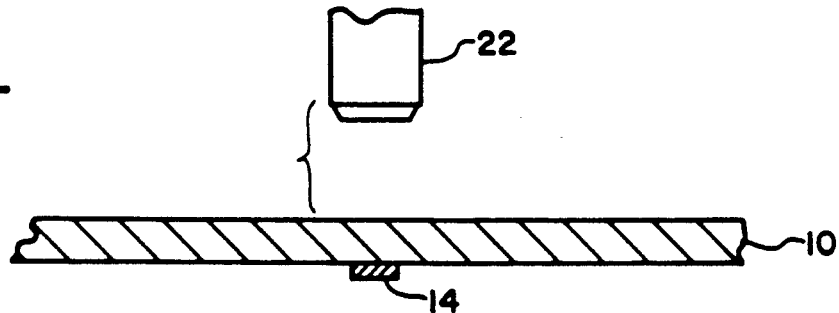

In a subsequent processing step, as illustrated in FIG. 1c, a blanket etching by a dry etch technique removes the amorphous silicon, but not the pattern of crystallized silicon 14 formed by the traversal of the laser beam over the fused quartz window. Using a plasma etch gas such s $SF_6$ or other halogen containing gas, the amorphous silicon is removed leaving only the crystallized silicon pattern. The etching characteristics of crystallized silicon is different from that of amorphous silicon causing a differential rate of etching which is sufficient to leave a pattern of crystallized silicon, whereas the amorphous silicon is completely removed.

An advantage of the present invention is that there is no lateral growth of the crystallized pattern region as the laser beam heats amorphous silicon. It provides for a pattern having very accurate dimensions. The width of the pattern can be accurately controlled over a range of less than 1 micron to 50 microns or greater. For wide patterns, several scans of the laser beam may be required.

In an alternative embodiment of the present invention, tungsten can be deposited on the crystallized silicon pattern. This can be accomplished by heating the fused quartz window in a process chamber which is preferably heated in a range of 400°–500° C. in the presence of tungsten hexafluoride. Tungsten will then be deposited on the crystallized silicon but not on the portion of the fused quartz window where the amorphous silicon was etched away.

It is known in the art that ultraviolet light can be used to enhance etching on various materials in a reaction chamber. Specifically, ultraviolet light can be provided to specific areas of a substrate to be etched to provide high selectivity between the irradiated portion and the non-irradiated irradiated portion of the substrate. As an example, $SiO_2$ on top of a silico substrate will be etched in the presence of chlorine gas being irradiated by ultraviolet laser light having a wavelength of 3,080–3,888 Å with sufficient power. Thereby, by irradiation of the substrate through a patterned window, a pattern can be etched into the $SiO_2$ layer on the silicon substrate.

Figure 2:
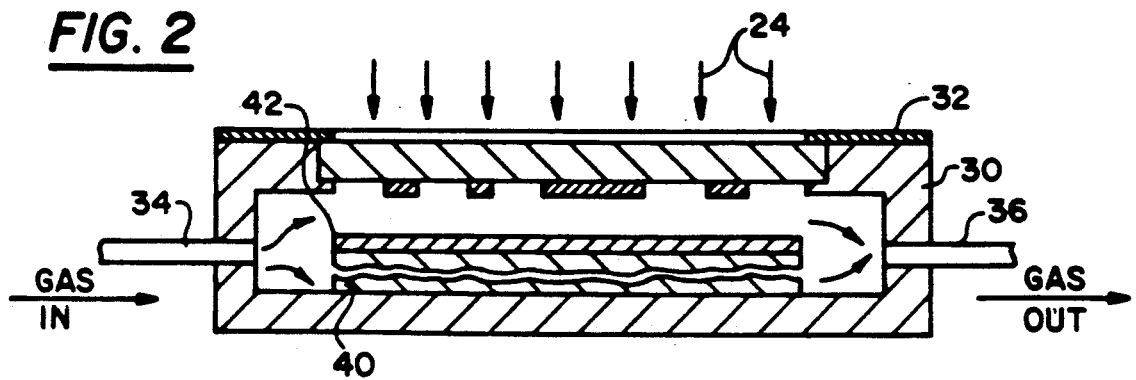
FIG. 2 shows the use of the laser generated pattern used as a mask to pattern a semiconductor device.

Shown in FIG. 2 is the quartz mask 10 mounted as a window to a gas containment chamber 30 having a sealable lid 32, inlet and outlet ports 34 and 36 respectively. Placed in the chamber is a semiconductor substrate 40 having a thin layer of silicon dioxide 42 to be patterned. A UV source 24 is provided by a laser having sufficient power in a wavelength range of 3,080–3,888 Å. Laser light is preferred because it is highly collimated and produces more accurate replication of pattern 14, on the quartz window, onto the semiconductor substrate. When a gas, such as $Cl_2$ is passed through the gas inlet 34, it will preferentially etch $SiO_2$ over crystallized silicon in the presence of ultraviolet radiation. The selectivity of $SiO_2$ over crystallized silicon is on the order of 10 to 1.

A machine can be built to first generate a mask and then transfer the pattern to the $SiO_2$ layer, as described above. Another method of etching the silicon dioxide according to the teachings of this invention is to deposit amorphous silicon directly on the silicon substrate and then generate a pattern in the amorphous silicon by raster scanning with an argon laser through the fused quartz window to crystalize the silicon in the same manner as that used to generate the mask described above. The pattern generated by the scanning laser is differentially etched by plasma etching to remove the amorphous silicon. The silicon dioxide is then etched in the manner previously described by etching in an atmosphere of chlorine gas using the crystallized silicon as a mask.

While the preferred embodiment has been disclosed in connection with the preferred embodiment thereof, it should be appreciated that other embodiments may be utilized in keeping with the spirit and scope of the present invention as defined by the independent claims.

What is claimed is:

1. A method of improving the throughput of a laser generated integrated circuit pattern comprising the steps of:
   depositing a changeable layer on a fused quartz window;
   changing selected regions of said changeable layer to form a pattern of activated regions;
   etching away the areas of said changeable layer not activated in said changing step;
   depositing a conductive material on said activated regions; and
   using the fused quartz window and said conductive material deposited thereon as a mask for etching semiconductor elements.

2. A method as in claim 1 wherein said conductive material is tungsten.

3. A method of improving the throughput of a laser generated integrated circuit pattern comprising the steps of:
   depositing an amorphous silicon layer on a fused quartz window;
   changing selected regions of said amorphous silicon layer to form a pattern of activated regions;
   etching away the areas of said amorphous silicon layer which are not activated;
   depositing a conductive material on said activated regions; and
   using the fused quartz window and said conductive material deposited thereon as a mask for etching semiconductor elements.

4. A method as in claim 3 wherein said conductive material is tungsten.

5. A method of improving the throughput of a laser generated integrated circuit pattern comprising the steps of:
   depositing an amorphous silicon layer on a fused quartz window;
   selectively heating regions of said amorphous silicon to form a pattern of recrystallized silicon;
   etching the areas of said amorphous silicon layer not recrystallized;
   depositing a conductive material on said recrystallized silicon regions; and
   using the fused quartz window and conductive material deposited thereon as a mask for etching semiconductor elements.

6. A method as in claim 5 wherein said conductive material is tungsten.

7. A method of improving the throughput of a laser generated integrated circuit pattern comprising the steps of:
   depositing an amorphous silicon layer on a fused quartz window;

selectively heating regions of said amorphous silicon to form a pattern of recrystallized silicon;

etching the area of said amorphous silicon layer not recrystallized;

heating said recrystallized amorphous silicon regions in the presence of WF gas to deposit tungsten on said recrystallized amorphous silicon regions; and using the fused quartz window with the tungsten deposited thereon as a mask for etching semiconductor elements.

8. A mask formed by the steps of:

depositing a changeable layer on a fused quartz window;

changing selected regions of said changeable layer to form a pattern of activated regions;

etching the areas of said changeable layer not activated;

depositing a conductive material on said activated regions; and using the fused quartz window and conductive material deposited thereon as a mask for etching semiconductor elements.

9. A method as in claim 8 wherein said conductive material is tungsten.

10. A method of improving the throughput of a laser generated integrated circuit pattern comprising the steps of:

depositing an amorphous silicon layer on a fused quartz window;

selectively heating regions of said amorphous silicon to form a pattern of crystallized silicon using a focused laser beam with a wavelength of about 5,145 Å; heating said crystallized silicon in the presence of $WF_6$ gas to deposit tungsten on said crystallized silicon regions;

etching the areas of said amorphous silicon layer not crystallized; and using the fused quartz window with the activated amorphous silicon layer thereon as a mask for etching semiconductor elements.

11. The method of claim 10 wherein the non-crystallized silicon is etched in a plasma process.

12. The method of claim 11 wherein the plasma etchant gas is sulfur hexaflouride.

* * * * *